United States Patent [19]

Lehrer

[11] 4,417,914
[45] Nov. 29, 1983

[54] METHOD FOR FORMING A LOW TEMPERATURE BINARY GLASS

[75] Inventor: William I. Lehrer, Los Altos, Calif.

[73] Assignee: Fairchild Camera and Instrument Corporation, Mountain View, Calif.

[21] Appl. No.: 362,333

[22] Filed: Mar. 26, 1982

Related U.S. Application Data

[63] Continuation-in-part of Ser. No. 243,989, Mar. 16, 1981, abandoned.

[51] Int. Cl.³ .................. C03B 29/00; C03B 32/00
[52] U.S. Cl. .................... 65/60.53; 65/3.12; 65/18.2; 65/60.51; 65/102; 427/93; 427/99; 501/55; 65/64; 65/106
[58] Field of Search ............. 65/3.12, 17, 32, 18.2, 65/DIG. 15, 60.8, 60.1, 60.5, 60.53, 60.51, 60.7, 18.1, 102, 106, 104, 63, 64; 427/99, 93, 82, 255.3; 501/40, 55

[56] References Cited

U.S. PATENT DOCUMENTS

| | | | |
|---|---|---|---|
| 3,542,572 | 11/1970 | Dalton et al. | 501/55 |
| 3,932,160 | 1/1976 | Camlibel et al. | 65/3.12 |
| 3,980,459 | 9/1976 | Li | 65/18.2 |
| 4,045,594 | 8/1977 | Maddocks | 427/99 |
| 4,123,565 | 10/1978 | Sumitomo et al. | 427/99 |
| 4,140,548 | 2/1979 | Zimmer | 427/93 X |
| 4,223,048 | 9/1980 | Engle | 427/255.3 X |
| 4,242,118 | 12/1980 | Irven | 65/18.2 X |
| 4,259,101 | 3/1981 | Tsukuda et al. | 65/18.2 |
| 4,261,772 | 4/1981 | Lane | 427/93 X |
| 4,263,031 | 4/1981 | Shultz | 65/18.2 X |
| 4,306,897 | 12/1981 | Maklad | 65/3.12 |
| 4,357,179 | 11/1982 | Adams et al. | 427/99 X |

FOREIGN PATENT DOCUMENTS

55-80733  6/1980  Japan .................... 65/3.12

OTHER PUBLICATIONS

Kern, Chemical Vapor Deposition Systems for Glass Passivation of Integrated Circuits; Solid State Technology vol. 18, No. 12; 12–1975, pp. 25–33.

Raymond; Conference: Proceedings of the 20th Electronic Components Conference, Cherry Hill, N.J.; May 14–16, 1979; Fabrication of Passive Components for High Temperature Instrumentation.

*Primary Examiner*—Kenneth M. Schor
*Attorney, Agent, or Firm*—Kenneth Olsen; Carl L. Silverman; Alan H. MacPherson

[57] ABSTRACT

The method of the invention provides a thin film deposit of a binary glass for use in integrated circuits which binary glass has a softening or flow point far below temperatures at which glasses normally used in connection with integrated circuits flow. After the binary glass has been deposited (on a semiconductor substrate), it is heated and reflowed. Preferably the glass comprises a mixture of germanium dioxide and silicon dioxide wherein the germanium dioxide is no greater than approximately 50 mole percent of the mixture. Phosphorus is added to the glass film for passivation of the underlying devices.

8 Claims, 3 Drawing Figures

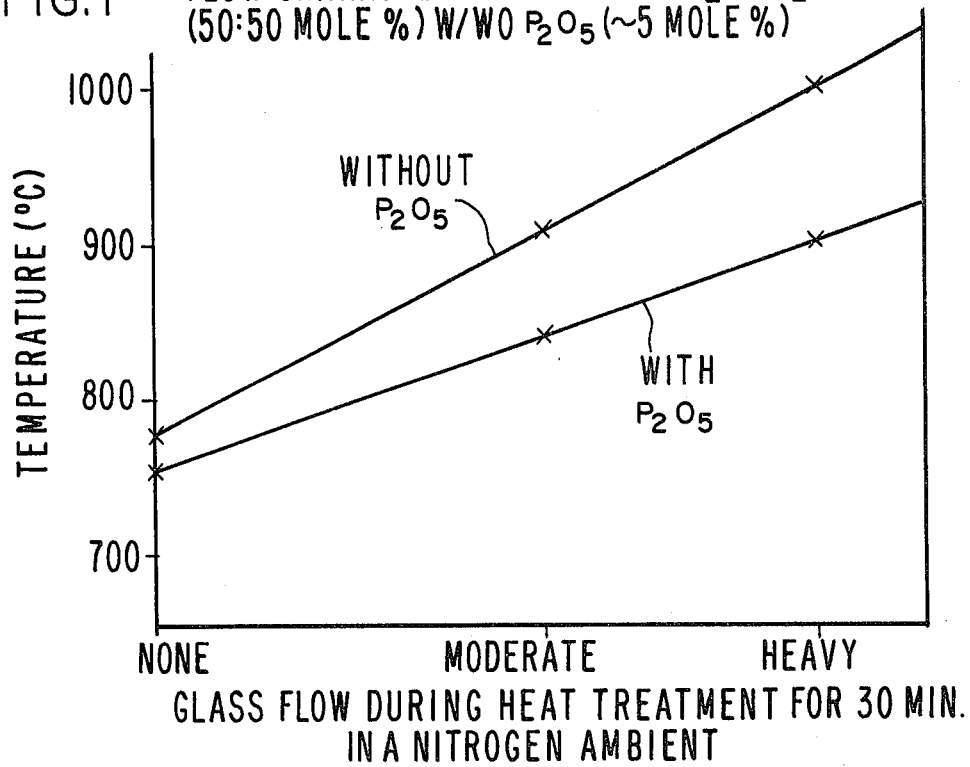
FIG. 1 FLOW CHARACTERISTICS FOR $SiO_2GeO_2$ (50:50 MOLE %) W/WO $P_2O_5$ (~5 MOLE %)
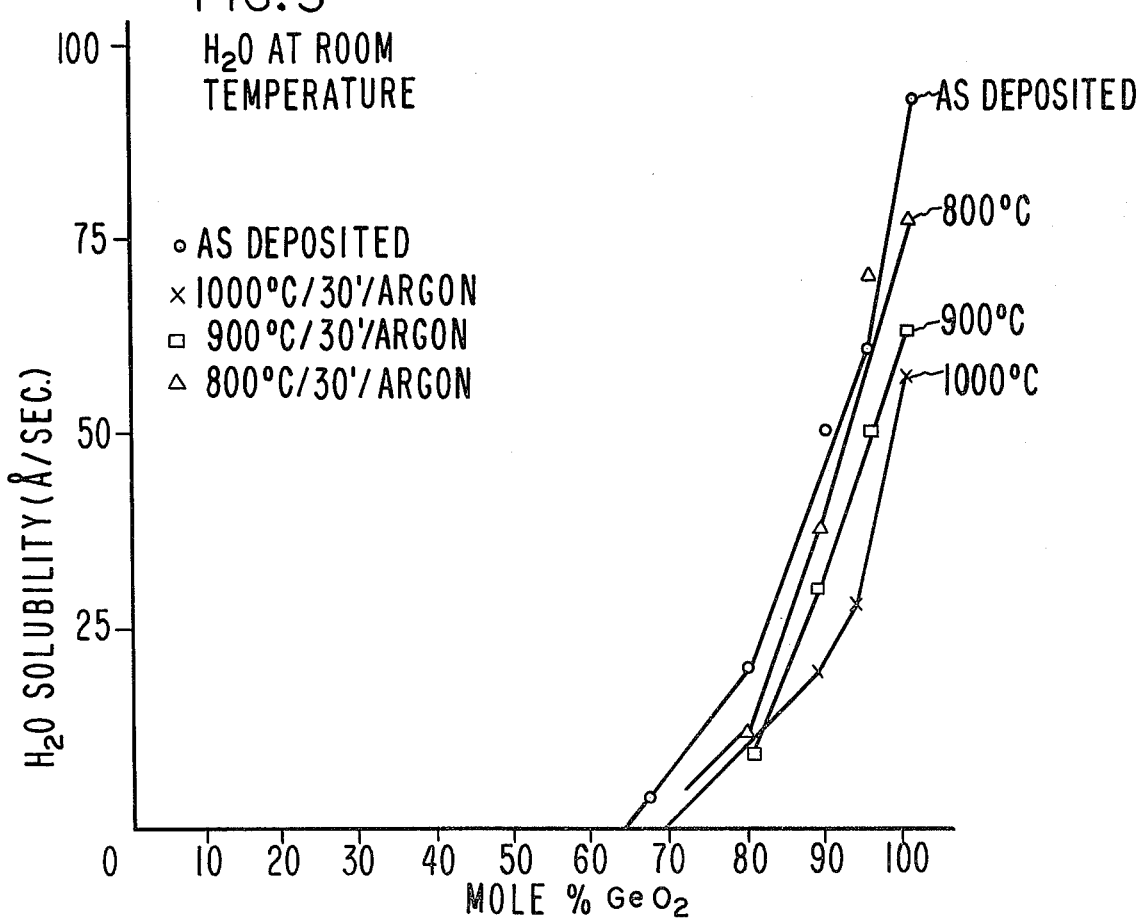
FIG. 3

METHOD FOR FORMING A LOW TEMPERATURE BINARY GLASS

CROSS-REFERENCE TO RELATED APPLICATION

This is a continuation-in-part of application Ser. No. 243,989 filed Mar. 16, 1981, now abandoned.

BACKGROUND OF THE INVENTION

1. Field of the Invention

This invention relates to a glass suitable for deposition by chemical vapor deposition ("CVD") techniques which has a softening (or "flow") point far below temperatures at which glasses currently used in the semiconductor industry flow.

2. Description of the Prior Art

The vapor deposition of phosphorus-doped silicon oxides onto a substrate is well-known. Such glasses are typically used to passivate the surfaces of integrated circuits made using silicon. Commonly denoted as "PVx" or "phosphorus doped vapox", glasses formed in this manner have very high reflow points in the range of 1000° C. to 1100° C. To reflow these glasses to remove sharp edges and provide curved, gradual-sloping surfaces on which conductive leads can easily be formed with gradual, rather than abrupt, changes in surface height, thereby to reduce the likelihood of such leads cracking or breaking, the integrated circuit must be heated to temperatures within the range of 1000° to 1100° C. Such high temperatures change the diffusion profiles of the various doped regions within the integrated circuit which give to the circuit its electrical characteristics. This is undesirable. Thus the fabrication of a semiconductor integrated circuit, particularly one using more than one level of conductive leads (known as a "multilevel" structure) becomes highly complicated with the final characteristics of the device differing somewhat from the characteristics of the device prior to the formation of the various levels of conductive leads.

The formation of glasses suitable for use as passivating and/or insulating layers in integrated circuits which reflow at temperatures significantly below the 1000° C. to 1100° C. temperatures at which glasses currently used in integrated circuits reflow is particularly important now that laser annealing and glass reflow techniques are becoming commonly used in semiconductor processing. In the past, various glass mixtures have been used or proposed to achieve lower reflow temperatures. Thus sedimented glasses have been proposed for use in the manufacture of integrated circuits with the constituents of the glasses being selected such that these glasses reflow at a substantially lower temperature than the reflow temperatures of commonly used phosphorus-doped vapor deposited oxides of silicon. Unfortunately, the techniques used to control the thicknesses of the deposited glasses and the technologies for depositing the glasses differ substantially from the techniques and technologies currently used in the semiconductor industry in the vapor deposition of oxides of silicon (both undoped and doped with phosphorus).

SUMMARY OF THE INVENTION

This invention substantially overcomes the above problems by providing a thin glass film suitable for use as insulation in semiconductor devices. The glass of this invention utilizes the same equipment as utilized to form the phosphorus doped vapox of the prior art but produces a glass which has a reflow point far below temperatures which cause dopant diffusion problems.

In accordance with this invention, a binary glass is deposited in a CVD (i.e., chemical vapor deposition) reactor from a germane/silane ($GeH_4/SiH_4$) co-deposition source by reacting these two gases at temperatures ranging from approximately 350° C. to 500° C. with oxygen in a nitrogen carrier gas. The resulting glass (a germanium dioxide-silicon dioxide mixture) has a useful range of flow points typically between approximately 700° C. to 900° C. thereby making it particularly attractive for use as a dielectric material in multilevel integrated circuit structures.

The addition of phosphorus in the form of phosphorus pentoxide ($P_2O_5$) by blending phosphine ($PH_3$) into the deposition gas stream at a selected percentage by weight results in an excellent passivated glass film which, by controlling the phosphorus level to be relatively low, substantially eliminates corrosion, a common problem in prior art integrated circuits using phosphorus-doped passivation of glass together with aluminum interconnect structures.

DESCRIPTION OF THE DRAWINGS

FIG. 1 illustrates the flow characteristics for the binary glass of this invention wherein the silicon dioxide and the germanium dioxide are arranged in 50-50 mole percent concentration, both with and without $P_2O_5$ added;

FIG. 3 is a graph illustrating the solubility in terms of angstroms per second of the binary $SiO_2$—$GeO_2$ glass in water at room temperature as a function of mole percent concentration of $GeO_2$ in the binary glass.

DETAILED DESCRIPTION OF THE INVENTION

Figure 2:
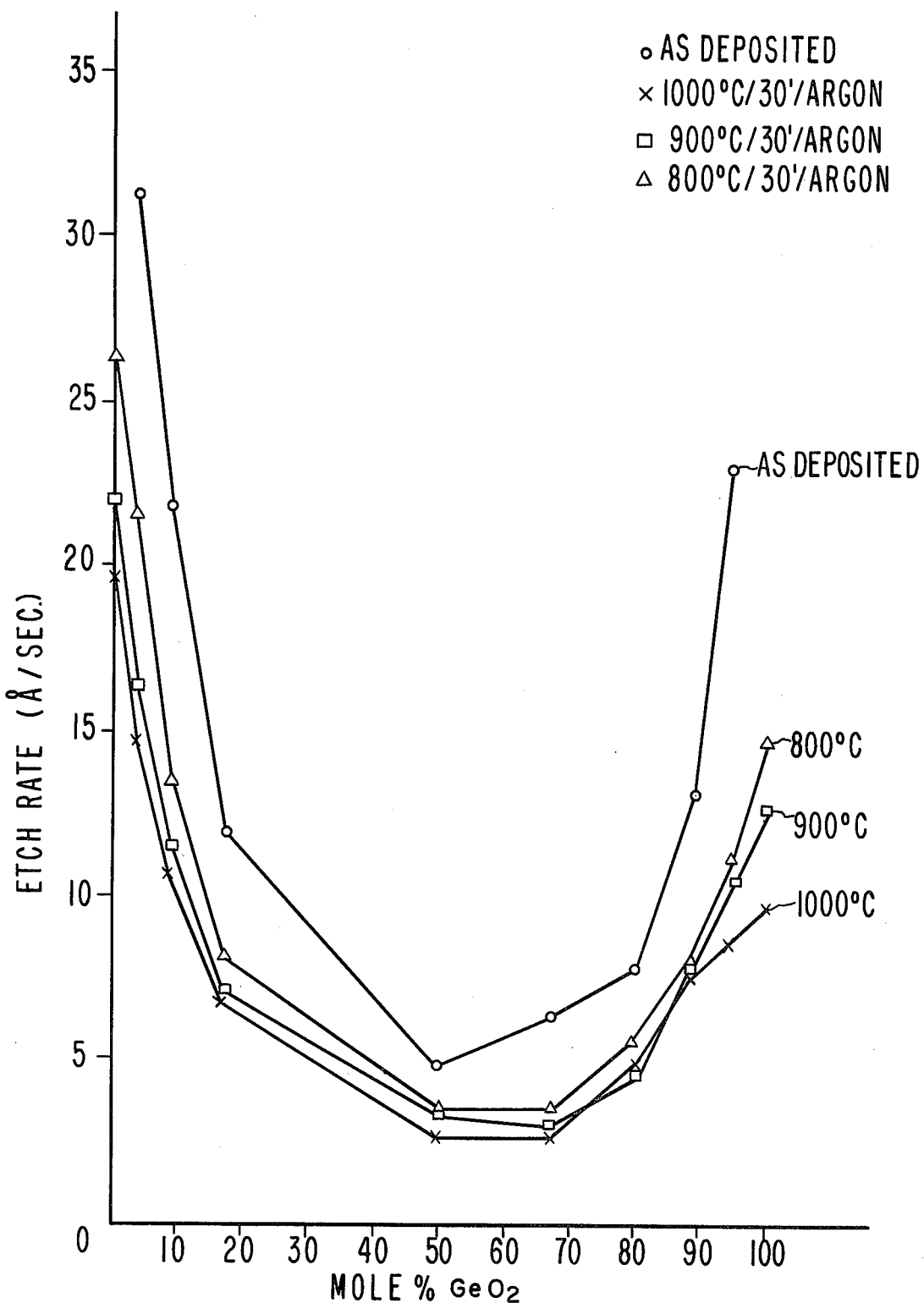
FIG. 2 illustrates the etch rate (angstroms per second) of the binary glass in a buffered HF etch as a function of the mole percent concentration of $GeO_2$ in the binary $SiO_2$—$GeO_2$ glass.

In accordance with this invention, a mixture of germanium dioxide and silicon dioxide is deposited on an appropriate substrate, such as a silicon wafer used in the manufacture of integrated circuits, in a conventional chemical vapor deposition reactor of a type commonly known and used in the semiconductor industry, from a co-deposition source of germane ($GeH_4$) and silane ($SiH_4$). In a preferred embodiment, the deposition is carried out by reacting these two gases at temperatures ranging from 350° C. to 500° C. with oxygen in a nitrogen carrier gas. A typical preferred ratio of gaseous constituents for the deposition of this glass is approximately:

| Constituents | Flow Rates |
|---|---|
| $GeH_4$ | 3.67 cc/min |
| $SiH_4$ | 7.33 cc/min |
| $O_2$ | 100.00 cc/min |
| $N_2$ | 2.00 L/min | where "cc" means cubic centimeters and "L" means liters. The above constituents are reacted at 400° C. Of importance, $GeH_4$ is more reactive than $SiH_4$. The constituents were flowed through a Pyrox atmospheric CVD reactor made by Tempress. The result of this reaction was a glass film which, undoped, had a nominal ratio of $SiO_2$ to $GeO_2$ of about 50-50 mole percent. This glass film flowed at about 850° C. when placed in a furnace with nitrogen at this temperature and held at this temperature for 30 minutes.

Germane ($GeH_4$) is a commercially available substance supplied by a number of vendors. The germane used in this process is of the quality generally available in the marketplace.

In a variation of this process, phosphorus is introduced by blending phosphine ($PH_3$) into the gas stream in an amount that will result in from three to nine percent (3-9%) by weight phosphorous pentoxide ($P_2O_5$) in the final film. The resulting phosphorus doped glass forms an excellent film and flows between 700° to 900° C.

A characteristic of germanium dioxide ($GeO_2$) is that this material exists in both soluble and relatively insoluble forms in water. When germanium dioxide is grown alone at normal temperatures, the resulting glass is soluble in water.

FIG. 1 illustrates the flow characteristics for the binary $GeO_2$—$SiO_2$ glass deposited in accordance with the teachings of this invention. The glass characterized by the graph of FIG. 1 comprises an $SiO_2$—$GeO_2$ glass in 50-50 mole percent of $SiO_2$ and $GeO_2$ both with and without phosphorous pentoxide ($P_2O_5$). The glass with phosphorous pentoxide contains five (5) mole percent of phosphorous pentoxide. FIG. 1 illustrates that during heat treatment for thirty (30) minutes in a nitrogen ambient, the glass with phosphorous pentoxide added flows heavily at a temperature slightly under 900° C. Heavy flow of the glass is obtained without phosphorous pentoxide at a temperature of slightly under 1000° C. Moderate flows are obtained without phosphorous pentoxide at a temperature around 900° C. and with phosphorous pentoxide at a temperature just over 800° C. Thus phosphorus pentoxide in the glass reduces the temperature required to achieve a given flow.

FIG. 2 illustrates that the etch rate using a standard oxide etch (a buffered HF known in the art as a "500 etch") of the binary glass is a minimum when the mole concentration of $GeO_2$ in the binary $GeO_2$—$SiO_2$ glass is about fifty (50) percent. A change in the mole percent concentration of $GeO_2$ relative to $SiO_2$ in either direction about this point results in an increase in the etch rate of this glass. The various curves illustrate also the effect on the etch rate of first flowing the deposited glass at three different temperatures (1000° C. for 30 minutes in argon gas, 900° C. for 30 minutes in argon gas and 800° C. for 30 minutes in argon gas). While the flowing of the glass flattens the curve of etch rate versus mole percent $GeO_2$ at its minimum such that the minimum etch rate occurs for a mole percent $GeO_2$ between about 50-70 mole percent, the range of minimum etch rates still includes a mole percent of $GeO_2$ of about 50%.

FIG. 3 illustrates the water solubility at room temperature of the binary $GeO_2$—$SiO_2$ glass as a function of mole concentration of $GeO_2$. FIG. 3 shows that the water solubility (in terms of angstrom per second of glass removed in water) is approximately zero beneath a mole percent concentration of $GeO_2$ of 60%. Accordingly, the mole percentage of $GeO_2$ in the binary glass should not exceed 60% and preferably, for safety, should remain somewhat beneath this percentage. When FIG. 3 is compared to FIG. 2 giving the minimum etch rate of the binary glass, it is clear that a mole percentage of $GeO_2$ of about 50% in the binary glass is optimum because for maximum preciseness and control in the etching of vias through the binary glass, a binary glass with minimum etch rate is desirable. Moreover, FIG. 1 illustrates that a 50-50 mole percent $SiO_2$—$GeO_2$ binary glass has satisfactory flow characteristics for integrated circuit structures. Thus, a binary glass of about 50-50 mole percent $SiO_2$—$GeO_2$ is preferred for use in this invention.

The resulting binary glass film is not significantly more water soluble than phosphorus-doped silicon dioxide (that is, its solubility is on the same order as PVx). Such a binary glass film is substantially insoluble in water. Ratios of atomic percent silicon to atomic percent germanium greater than 0.81 are water insoluble and can be etched by standard silicon dioxide etching techniques.

The addition of phosphorus in the form of $P_2O_5$ in the range of 3% to 9% by weight to the resulting glass lowers the softening temperature of the glass to about 700° C. Without phosphorus, the glass begins to soften at approximately 800° C.

An important feature of the binary glass of this invention is that it can be deposited using standard equipment currently used in the semiconductor industry for the deposition of phosphorus doped oxides of silicon. Thus the basic deposition technology and equipment is already available for use in practicing this invention.

By increasing the phosphorus content in the binary glass mixture to 3-9% and heating the glass under 20 atmospheres pressure, the glass has been experimentally flowed at 650° C. This allows glass to be reflowed at a temperature slightly beneath that at which aluminum melts (aluminum melts at about 660° C.). Although an aluminum-silicon eutectic melts at 577° C. and an aluminum copper eutectic melts at 548° C., the glass of this invention closely approaches these melting points thereby, in some instances, making it possible to reflow glass following the deposition of aluminum interconnects without melting the aluminum interconnects. The glass of this invention is particularly suitable for use with localized glass reflow techniques involving the use of lasers wherein local regions of the glass can be reflowed without significantly increasing the temperature of adjacent portions of the semiconductor circuit. Thus, even though the melting temperature of the glass is slightly higher than that of aluminum, with careful control of the areas heated the melting temperature of this glass is sufficiently low that glass can be locally heated and reflowed without melting adjacent regions of aluminum.

Although phase diagrams for germanium dioxide/silicon dioxide mixtures are known for bulk systems, these phase diagrams generally do not apply to the thin films commonly employed in the semiconductor industry. As used herein, the term "thin film" is meant to refer to a film of silicon dioxide/germanium dioxide having a thickness generally less than about 5 microns and typically less than about 2 microns. The thicknesses of films formed using the techniques of this invention for insulation layers in integrated circuits can drop as low as several hundred angstroms under proper conditions but more typically range in the thousands of angstroms.

"Flow temperature" or "reflow temperature" is used herein to indicate that temperature to which a glass film with a rough surface topography must be heated to produce a significant smoothing of the glass surface in thirty (30) minutes. In general, higher temperatures produce faster flows.

EXAMPLE 1

A typical composition suitable for deposition over an interconnect structure comprising either aluminum, polysilicon or a polysilicide comprises a binary glass consisting of forty-nine (49) mole percent $SiO_2$, forty-nine (49) mole percent $GeO_2$ and two (2) mole percent $P_2O_5$ (corresponding to about 3.9 weight percent $P_2O_5$ in the resulting glass).

EXAMPLE 2

Typical deposition conditions using a Pyrox atmospheric CVD reactor made by Tempress involved the flow of germane ($GeH_4$), silane ($SiH_4$), oxygen ($O_2$), nitrogen ($N_2$) and phosphine ($PH_3$) in the Pyrox reactor at the following flow rates:

| Constituents | Flow Rates |
| --- | --- |
| $GeH_4$ | 3.67 cc/minute |
| $SiH_4$ | 7.33 cc/minute |
| $O_2$ | 100 cc/minute |
| $N_2$ | 2 liter/minute |
| $PH_3$ (1% in $N_2$) | 11 cc/minute |

The substrates on which the glass was deposited comprised patterned silicon wafers held at 400° C. The binary glass deposited at a rate of approximately 300 angstroms per minute.

Other embodiments of this invention will be obvious to those skilled in the art in view of the above description. The above description is intended only to be exemplary and not limiting.

I claim:

1. The method of forming and smoothing a thin glass film, comprising:
    (a) reacting a gaseous mixture of germane and silane with oxygen at a reaction temperature of from 350°–500° C. to form a mixed germanium oxide/silicon oxide glass vapor;
    (b) depositing said glass mixture vapor on a semiconductor substrate as a film of less than about 5 microns in thickness, said germanium oxide being about 50 mole percent of the germanium oxide/silicon oxide glass mixture; and
    (c) reflowing the resulting glass film at a temperature range of approximately 700° C. to 900° C. to smooth the surface topography of the film.

2. The method of claim 1 wherein the method of depositing said binary glass comprises reacting the compounds of germanium and silicon in a chemical vapor deposition reactor at selected temperatures.

3. The method of claim 2 wherein the reaction constituents comprise germane and silane.

4. The method of claim 3 wherein said germane and silane gases are reacted at temperatures ranging from 350° C. to 500° C. with oxygen in a nitrogen carrier gas.

5. The method of claim 4 wherein the germane has a flow rate of approximately 3.67 cc/min, the silane has a flow rate of approximately 7.33 cc/min, and the germane and silane are reacted with oxygen in a nitrogen carrier gas wherein the oxygen has a flow rate of approximately 100 cc/min and the nitrogen has a flow rate of approximately 2 liters/min.

6. The method of claim 5 wherein the reaction occurs at approximately 400° C.

7. The method of claim 1 further including introducing a phosphorous compound into said reacting mixture to provide a resultant phosphorous doped glass film.

8. The method of claim 7 in which said phosphorous doped glass film contains from 3 to 9% by weight of phosphorous compound.

* * * * *